United States Patent
Kreitz

[15] 3,684,981
[45] Aug. 15, 1972

[54] MONOLITHIC INTEGRABLE CRYSTAL OSCILLATOR CIRCUIT

[72] Inventor: Walter Kreitz, Gundelfingen, Germany

[73] Assignee: ITT Industries, Inc., New York, N.Y.

[22] Filed: July 2, 1971

[21] Appl. No.: 159,384

[30] Foreign Application Priority Data

July 15, 1970 Germany..........P 20 34 990.0

[52] U.S. Cl.............331/116 R, 331/108 D, 331/159
[51] Int. Cl................................................H03b 5/36
[58] Field of Search...................331/116, 108 A, 159

[56] References Cited
UNITED STATES PATENTS 3,585,526 6/1971 Zelinka......................331/113

*Primary Examiner*—John Kominski
*Attorney*—C. Cornell Remsen, Jr. et al.

[57] ABSTRACT

This is a monolithic integrable crystal oscillator circuit wherein the quartz is connected between the emitter of two transistors. The emitter resistors are replaced by transistors connected as constant current sources. The collector resistors are replaced by complementary transistors.

4 Claims, 2 Drawing Figures

INVENTOR
WALTER KREITZ

BY Stephen A. Young
ATTORNEY

MONOLITHIC INTEGRABLE CRYSTAL OSCILLATOR CIRCUIT

BACKGROUND OF THE INVENTION

The present invention relates to a monolithic integrable crystal oscillator circuit in which the piezoelectric crystal is connected to the emitters of two transistors of the same conductivity type whose bases and collectors are crosswise directly interconnected and in which each of the two transistors has one collector resistor and one emitter resistor.

In C.Rint's "Handbuch fuer Hochfrequenz und Elektrotechniker," vol. 2, Berlin 1953, p. 180, a crystal oscillator circuit using a quartz as the piezoelectric crystal is illustrated in FIG. 32*b* which contains two triode tubes, the quartz interconnecting the cathodes of the two tubes. The grids and plates of the two tubes are crosswise interconnected; one plate load resistor and one cathode resistor are provided for each tube. In the above referred to handbook, this circuit is designated as a series circuit, which means that the quartz oscillates at a frequency which corresponds to the series resonant frequency derivable from the equivalent electric circuit of a quartz. This circuit intended for tubes can also be realized with the aid of transistors, in which case the circuit may be designed so that monolithic integration is possible.

If a crystal oscillator circuit is to be monolithically integrated, the four resistors contained in the circuit obstruct the integration as they require a considerable part of the crystal surface due to their high resistance. If such an oscillator circuit is to be designed also with a view to lowest possible current consumption as is required in some applications, this requirement, with given operating voltage, can only be met by making the collector and emitter resistors as highly resistive as possible. In this case, the required resistance and, consequently, the required area increase still further.

SUMMARY OF THE INVENTION

It is therefore desirable that, if the above referred to crystal oscillator circuit is to be monolithically integrated, the number of resistors required be considerably reduced.

It is therefore the object of the invention to design the above referred to crystal oscillator circuit so that the required resistance is considerably reduced.

The invention is characterized in that each of the collector resistors is a transistor complementary to the oscillator transistors whose emitter is connected to the supply voltage source and whose collector-base path is connected in parallel to that of the associated oscillator transistor, and that each of the emitter resistors is a transistor of the same conductivity type as that of the oscillator transistors whose emitter is connected to ground and whose collector is connected to the emitter of the associated oscillator transistor and whose base is connected to a source of constant potential common to said two transistors. The source of constant potential may appropriately be a diode, e.g. a zener diode, which is connected via a series resistor to the supply voltage source.

If this source of constant potential is to be monolithically integrated with the crystal oscillator circuit, it is particularly advantageous if the diode is realized by connecting the emitter of a transistor which has the same conductivity type as the oscillator transistors to ground while its base and its collector are interconnected.

In an advantageous embodiment of the invention, the base of a first additional transistor which is of the same conductivity type as the oscillator transistors may be connected to the output of the crystal oscillator circuit, the collector of the additional transistor being connected to the supply voltage source and the emitter being connected to the collector of a second additional transistor which also is of the same conductivity type as the oscillator transistor. The emitter of the second additional transistor is connected to ground while the base is connected to the source of constant potential.

DESCRIPTION OF THE PREFERRED EMBODIMENTS

The circuit arrangement shown in FIG. 1 consists of the two transistors T1 and T2 which hereinafter will be referred to as oscillator transistors. Their bases and collectors are crosswise interconnected, i.e. the base of transistor T1 is connected to the collector of T2 while the base of transistor T2 is connected to the collector of T1.

A piezoelectric crystal S, which commonly is a quartz oscillating at the desired oscillator frequency, is respectively connected through each of its two outer terminals to the emitters of the oscillator transistors. Arranged between the respective emitter of the oscillator transistors and ground is the respective collector-emitter path of the transistors T5 and T6, their emitters being connected to ground. The transistors T5 and T6 are of the same conductivity type as the oscillator transistors. The bases of the two transistors T5 and T6 are connected with one another and to the source $U_c$ of constant potential.

Between the collector of the respective oscillator transistor and the supply voltage source U, the respective collector-emitter path of the complementary transistors T3 and T4 is connected so that their emitters are connected to the supply voltage source and their base-collector paths are connected in parallel to that of the oscillator transistors.

The output a.c. voltage u may be taken off the interconnected collectors of the transistors T1, T3 or T2, T4.

Figure 1:
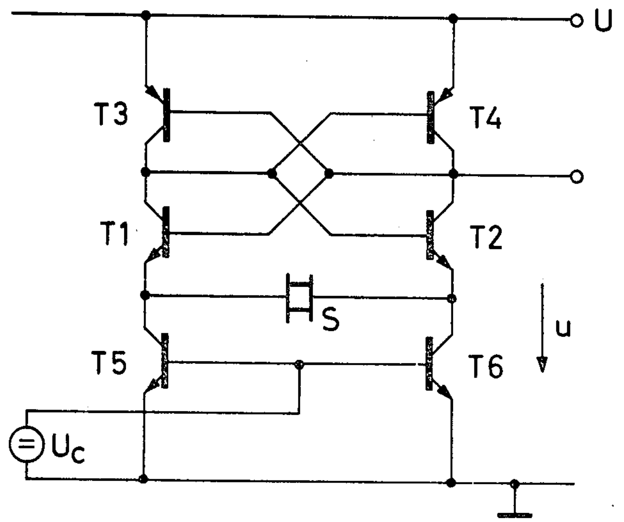
FIG. 1 shows the circuit arrangement according to the invention.
Figure 2:
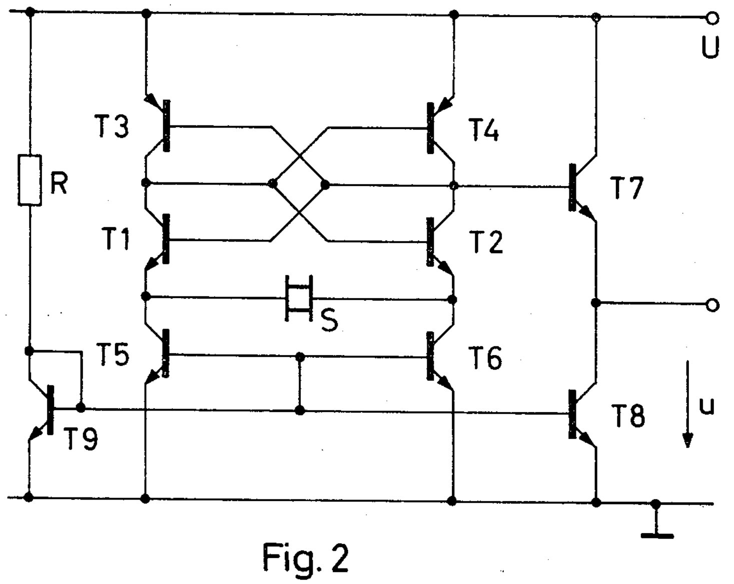
FIG. 2 shows an advantageous embodiment of the circuit arrangement of FIG. 1.

An advantageous embodiment of the circuit of FIG. 1 is shown in FIG. 2. Here, the output a.c. voltage u is applied to the base of a first additional transistor T7 whose collector is connected to the supply voltage source and whose emitter is connected to the collector of a second additional transistor T8. The emitter of the second additional transistor T8 is connected to ground while the base of this transistor is connected to the source $U_c$ of constant potential. The two additional transistors T7, T8 are of the same conductivity type as the oscillator transistors.

As already mentioned, the source $U_c$ of constant potential may be a diode to which the supply voltage is applied via the series resistor R. This source of constant potential is appropriately also included in the monolithic integrated circuit. In this case, the diode may be formed by a further transistor T9 whose emitter is connected to ground while base and collector are connected with one another and to the series resistor R.

The circuit arrangement of FIG. 1, unlike the above referred to transistorized crystal oscillator circuit based on the well-known tube circuit, contains no resistor. Thus, in the case of monolithic integration, considerable crystal areas are saved which may be used for any further circuit stages. On the other hand, the advantageous embodiment of the circuit arrangement of FIG. 2 contains only the resistor R, so that the required resistance area is reduced to about one fourth compared to the above referred to circuit arrangement. The circuit arrangement according to the invention has the additional advantage of containing no capacitors which, in the case of monolithic integration, would also require large crystal areas.

The crystal oscillator circuit according to the invention may be used, for example, as the control and generator stage of a frequency divider chain. In this case, the frequency divider chain, too, may be monolithically integrated.

The crystal oscillator circuit according to the invention can also be employed with low operating voltages and operating currents, so that it can be used as the generator stage of quartz-controlled clocks. However, it is obvious that the crystal oscillator circuit according to the invention is suitable for all applications in which a high frequency stability of such circuits is required, e.g. in signal generators, frequency meters, etc.

Finally, it should be mentioned that, in the present case, "monolithic integration" does, of course, not means that the piezo-electric crystal is to be included in the monolithic semi conductor solid state circuit. The term "monolithic integration" rather relates, of course, only to the semiconductor devices arranged in the circuit which may be accommodated in a single semiconductor crystal by well-known techniques.

It is to be understood that the foregoing description of specific examples of this invention is made by way of example only and is not to be considered as a limitation on its scope.

I claim:

1. A crystal oscillator circuit including a monolithic integrable circuit, said monolithic circuit further includes first and second oscillator transistors of the same conductivity type, the base of said first transistor being connected to the collector of said second transistor and the base of said second transistor being connected to the collector of said first transistor, each of said first and second transistors having a respective first and second collector resistance and a respective first and second emitter resistance, a piezoelectric crystal connected between the respective emitter of each of said first and second transistors, a supply voltage source connected to the respective collector resistance of each of said first and second transistors and a source of constant potential, wherein the improvement comprises:

said first and second collector resistance being formed by a respective first and second complementary transistor, the emitter of each of said first and second complementary transistors being connected to said supply voltage source, the base of said first complementary transistor being connected to the base of said first oscillator transistor and the base of said second complementary transistor being connected to the base of said second oscillator transistor, and the collector of said first complementary transistor being connected to the collector of said first oscillator transistor and the collector of said second complementary transistor being connected to the collector of said first oscillator transistor; and said first and second emitter resistance is formed by respective third and fourth transistors of the same conductivity type as that of said first and second oscillator transistors, the collector of said third transistor being connected to the emitter of said first oscillator transistor and the collector of said fourth transistor being connected to the emitter of said second oscillator transistor, the emitter of said third and fourth transistors being connected to circuit ground, and the base of said third and fourth transistors being connected to said source of constant potential.

2. A crystal oscillator circuit according to claim 1, further comprising:

fifth and sixth transistors of the same conductivity type as said first and second oscillator transistors, the collector of said fifth transistor being connected to said supply voltage source, the base of said fifth transistor being connected to the collector of said second oscillator transistor, the emitter of said fifth transistor being connected to the collector of said sixth transistor, the emitter of said sixth transistor being connected to the circuit ground, and the base of said sixth transistor being connected to said source of constant potential.

3. A crystal oscillator circuit according to claim 1, wherein said source of constant potential includes a diode and a resistor, one terminal of said resistor being connected to said supply voltage source, the other terminal of said resistor being connected to the anode of said diode, the cathode of said diode being connected to circuit ground, whereby the voltage across said diode represents said source of constant potential.

4. A crystal oscillator circuit according to claim 3, wherein said diode is formed by a seventh transistor of the same conductivity type as said first and second oscillator transistors, the emitter of said seventh transistor being connected to the circuit ground, and the base and collector of said seventh transistor being interconnected.

* * * * *